United States Patent [19]

Sengle et al.

[11] Patent Number: 5,734,192
[45] Date of Patent: Mar. 31, 1998

[54] TRENCH ISOLATION FOR ACTIVE AREAS AND FIRST LEVEL CONDUCTORS

[75] Inventors: Edward W. Sengle, Hinesburg; Mark D. Jaffe, Colchester; Daniel Nelson Maynard, Craftsbury Common, all of Vt.; Mark Alan Lavin, Katonah, N.Y.; Eric Jeffrey White, North Ferrisburg; John A. Bracchitta, So. Burlington, both of Vt.

[73] Assignee: International Business Machines Corporation, Armonk, N.Y.

[21] Appl. No.: 581,680

[22] Filed: Dec. 22, 1995

[51] Int. Cl.⁶ .......................................... H01L 29/00
[52] U.S. Cl. .................................. 257/506; 257/513
[58] Field of Search .......................... 257/508, 513, 257/524, 374, 510, 506

[56] References Cited

U.S. PATENT DOCUMENTS

| | | | |
|---|---|---|---|
| 4,746,963 | 5/1988 | Uchida et al. | 257/372 |
| 4,903,095 | 2/1990 | Chapron | 257/510 |
| 5,057,895 | 10/1991 | Beasom | 257/524 |
| 5,214,302 | 5/1993 | Uchida et al. | 257/370 |
| 5,357,133 | 10/1994 | Morita | 257/316 |
| 5,381,033 | 1/1995 | Matsuzaki | 257/499 |

Primary Examiner—Sara W. Crane
Attorney, Agent, or Firm—James M. Leas

[57] ABSTRACT

A trench isolation structure for a semiconductor is provided including an isolation ring and an isolation path. The isolation ring surrounds active semiconductor areas and is bordered on the outside by inactive semiconductor area. The isolation path extends from the isolation ring through the inactive semiconductor area. A first level conductor on the isolation path electrically connects or capacitively couples a device in the active semiconductor area to a location on the substrate outside the isolation ring. The isolation path has a configuration derived from the layout of the conductor.

20 Claims, 4 Drawing Sheets

TRENCH ISOLATION FOR ACTIVE AREAS AND FIRST LEVEL CONDUCTORS

FIELD OF THE INVENTION

This invention generally relates to isolation for semiconductor structures such as integrated circuits. More particularly it relates to a layout for isolation that reduces the cost and process complexity of trench isolation. Even more particularly, it relates to a layout for isolation that provides narrow regions of isolation around active areas and under first level conductors.

BACKGROUND

Isolation is provided in a semiconductor between transistors on a semiconductor chip to prevent unwanted electrical connections therebetween.

Local oxidation of silicon (LOCOS) has long been the conventional process for fabricating isolation, and it has the advantage of being both relatively inexpensive and capable of providing isolation over wide areas of a chip. LOCOS has several disadvantages, however, among them the formation of a bird's beak that increases the horizontal space of the isolation, reducing the density of devices on a chip.

Because of its more vertical sidewalls and more planar surface trench isolation provides significant advantage over LOCOS in the quest for providing a high density of integrated circuits. Trench isolation schemes are therefore finding increasing use in semiconductor processing. However, because of the difficulty of planarizing, trench isolation is more complex and expensive to process.

Trench isolation process complexity is evident from a brief description of the conventional shallow trench isolation (STI) process. First, thick silicon nitride is deposited on thin silicon dioxide on the semiconductor surface. Then, in a first photolithography step, a mask is formed in the layers of insulator defining the areas where STI is desired. Next, the semiconductor is etched, using a reactive ion etch (RIE) process, to form shallow trenches. A thin layer of silicon dioxide is then thermally grown and a conformal silicon dioxide layer is deposited, filling the shallow trenches.

A lengthy series of steps, such as the sequence described below, is then used solely to planarize the surface. The typical planarization process is quite complex because (1) the oxide deposition is usually conformal, and therefore narrow areas of isolation may be at a higher level than wide areas of isolation; and (2) wide areas of isolation polish much more quickly than narrow areas, a problem known as dishing.

Dishing is a problem, first because oxide in these large areas of STI is thinner than in narrow areas, and second because in regions having a low density of devices, the nitride polish stop layer over small, isolated active area regions may be completely polished off, and then the active area may get polished down, introducing potential damage to the semiconductor crystal.

To overcome these difficulties the planarization steps may involve applying a planarizing material, such as spin-on-glass or photoresist. For example, one conventional process uses two photoresist applications and a masking step for planarizing. In addition, tight control over plasma etching and chemical-mechanical polishing steps are needed, all adding significantly to the process complexity of trench isolation compared to conventional LOCOS. The photoresist application and masking step planarizes by providing photoresist exclusively in the isolation areas (the low areas), and removing photoresist from the active areas (the high areas). The resist thickness is designed to equal the shallow trench depth, so the surface of the remaining resist is roughly coplanar with the surface of the exposed oxide film over active areas. The next photoresist layer is spun-on (but no expose or develop step is used) to further smooth out local variations in the developed resist pattern, resulting in a photoresist and oxide surface that is both locally and globally planar. An RIE process then etches back both the photoresist and the oxide at about the same rate to a point below irregularities in the oxide, rendering the wafer surface largely planar. A final touch-up chemical-mechanical polish (CMP) is then used to remove any local irregularities and complete the oxide removal over active areas.

Even with this process complexity, the results of the conventional STI process are frequently unsatisfactory. Substantial dishing is found in areas having a large expanse of STI or a low density of devices. Furthermore, the process complexity introduced to overcome dishing increases cost and cycle time and reduces yield. Thus, an alternate scheme for providing trench isolation, without the need for a complex series of planarization steps, is needed and is provided by the following invention.

SUMMARY OF THE INVENTION

It is therefore an object of the present invention to reduce the cost and complexity of STI and to increase the yield of product having STI.

It is a further object of the present invention to avoid dishing of areas with a low density of devices without adding process complexity.

It is another object of the present invention to eliminate extra photoresist application and exposure steps during STI processing.

It is another object of the present invention to provide isolation both horizontally between active semiconductor areas and vertically between a first level of conductor and the silicon surface.

It is a feature of the present invention that large expanses of STI are replaced with inactive semiconductor areas, there being narrow rings of STI immediately surrounding active semiconductor areas and STI paths underlying first level conductors, the paths little wider than the conductors.

It is a feature of the present invention that the design of an isolation mask includes the layouts of active semiconductor areas and of first level conductors, including gate conductors and local interconnects, where the first level conductors extend beyond active semiconductor areas.

It is an advantage of this invention that dishing of active semiconductor areas and STI is eliminated by design rather than process.

It is an advantage of this invention that the cost, complexity, defects, and cycle time of STI processing are significantly reduced, while yield is improved.

It is an advantage of this invention that process window during chemical-mechanical polishing of STI is increased.

These and other objects of the invention are accomplished by the isolation structure of the present invention. The structure includes a semiconductor substrate having an isolation ring having an inside edge and an outside edge. An active semiconductor area borders the inside edge, and the active semiconductor area includes a device. An inactive semiconductor area borders the outside edge. A trench isolation path extends from the outside edge to a location on the substrate outside the isolation ring. The inactive semiconductor area borders at least two sides of the isolation path. A first level conductor is on the isolation path. The first level conductor electrically connects or capacitively couples the device to the location. The isolation path electrically insulates the conductor from the inactive semiconductor.

BRIEF DESCRIPTION OF THE DRAWINGS

The foregoing and other objects, features, and advantages of the invention will be apparent from the following detailed description of the invention, as illustrated in the accompanying drawings, in which:

FIGS. 1b–1c are cross sectional views along b-b' and a-a' of FIG. 1a;

DETAILED DESCRIPTION OF THE INVENTION

The present invention provides a ring of isolation around each active semiconductor area. The invention also provides paths of isolation through inactive semiconductor areas under first level conductors. The layout of the paths of isolation is derived from the layout of the first level conductors by shifting the edge of the conductor outward at each point a fixed dimension d. The dimension added should be sufficient to at least account for overlay tolerance. It can also be as much as 10 to 50 micrometers in most locations without leading to substantial dishing. These paths of isolation are usually quite narrow compared to the wide expanses of isolation found under first level conductors on many conventional chips. Thus, the present invention addresses the dishing problem by providing a design in which wide areas of isolation are eliminated, replaced by wide areas of inactive semiconductor through which extend paths of isolation. Because the wide areas of isolation are eliminated in the design or layout of the present invention, the need for complex and expensive process steps to planarize, while avoiding dishing, is eliminated as well.

The term "first level conductors," as used in this application includes both gate conductors and local interconnects. Gate conductors are usually formed first, in a first deposition and masking step. After such steps as implants for source/drain diffusions and high temperature anneal, local interconnects are deposited and defined in a second masking step. Local interconnects may make contact with the source/drain regions or gates.

The term "devices" as used in this application includes structures such as transistors, diodes, resistors, capacitors, and isolated contacts.

The term "horizontal" as used in this application is defined as a plane parallel to the conventional planar surface of a semiconductor chip or wafer, regardless of the orientation the chip is actually held. The term vertical refers to a direction perpendicular to the horizontal as defined above. Prepositions, such as "on," "side," and "under" are defined with respect to the conventional planar surface being on the top surface of the chip or wafer, regardless of the orientation the chip is actually held.

Semiconducting substrates are formed from materials such as silicon, germanium, and gallium arsenide. Silicon will be used for illustration below.

Figure 1A:
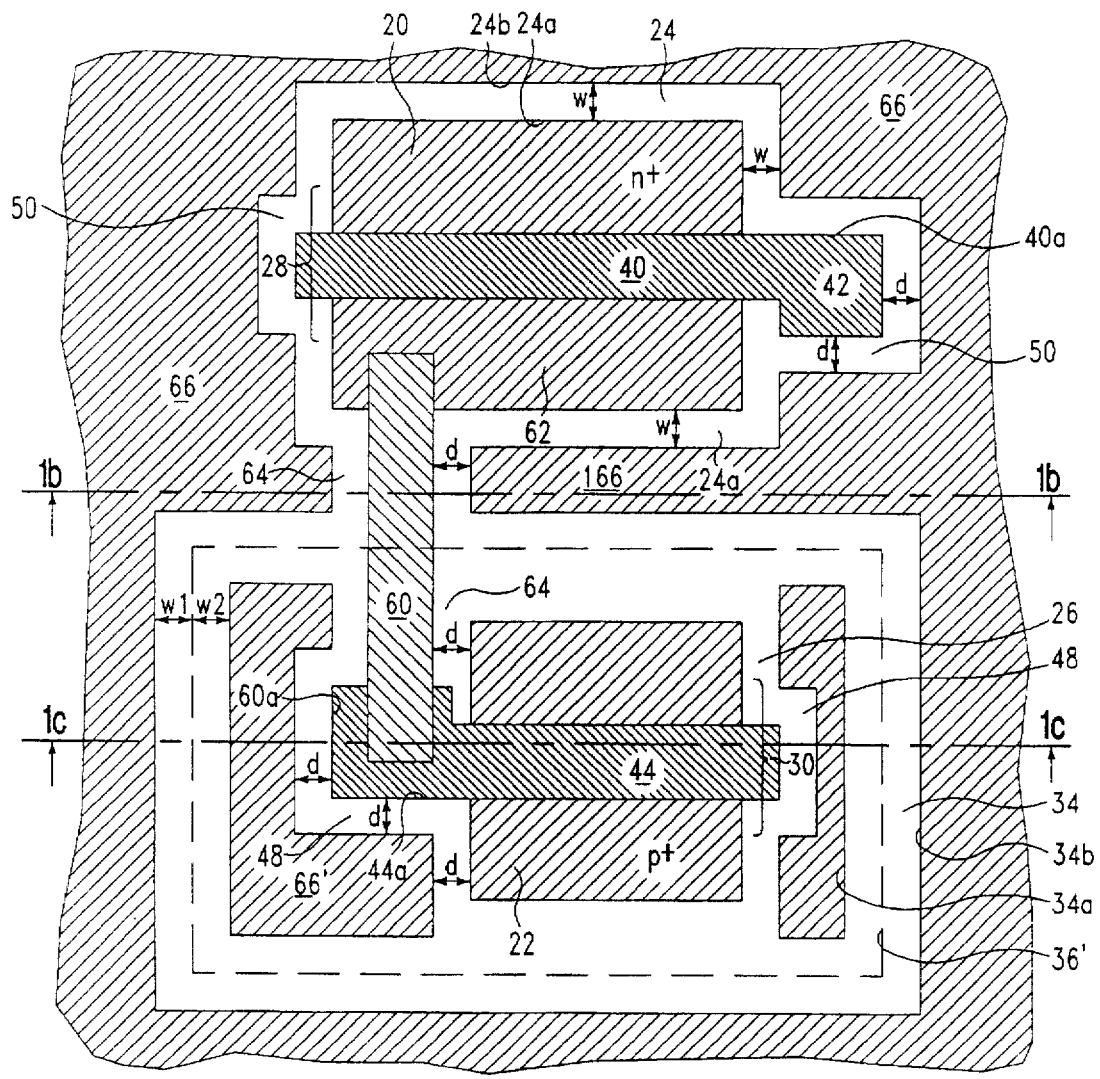
FIG. 1a is a planar diagram illustrating the layout of active semiconductor areas, isolation, first level conductors, n-well, and inactive semiconductor areas of the present invention.
Figure 1B:
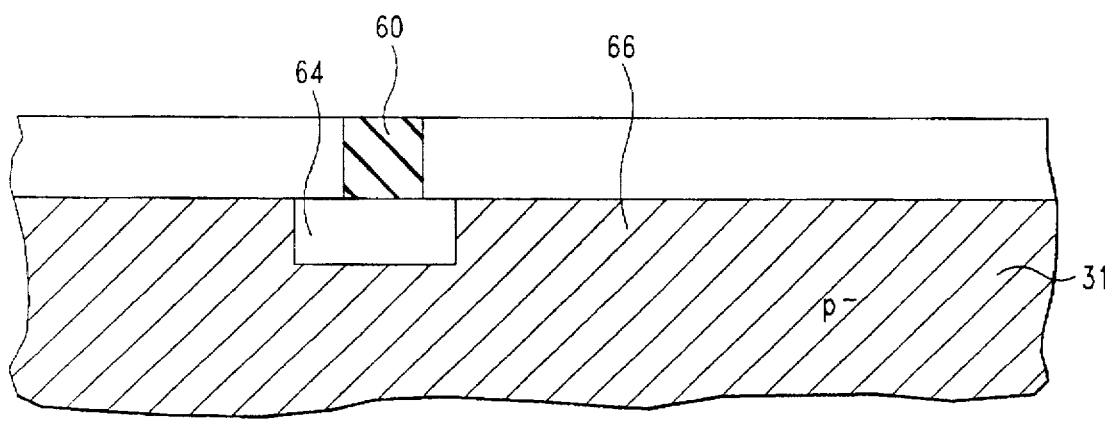
Figure 1C:
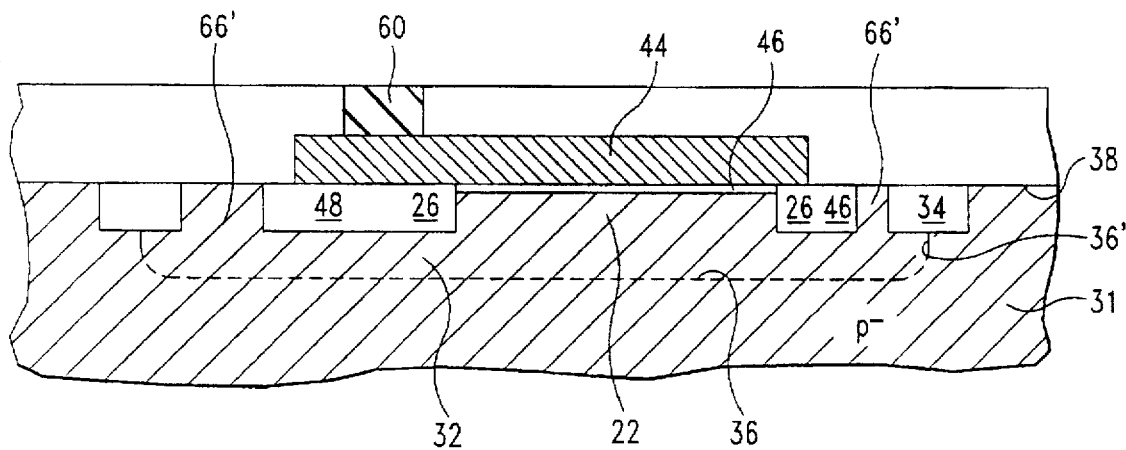

Referring now to FIGS. 1a–1c, active silicon areas 20 and 22 are surrounded by isolation rings 24 and 26, the isolation rings having a width w, typically in the range of about 0.4 to about 10 micrometer. Active silicon areas 20 and 22 contain n- and p-channel FETs 28 and 30 respectively. Active silicon area 20 is located on p- substrate 31 (FIGS. 1b–1c) while active silicon area 22 is located within n-well 32. N-well 32 is surrounded by isolation ring 34 extending horizontally on both sides of n-well junction edge 36', where junction 36 would otherwise intersect silicon surface 38.

For highest circuit density, isolation ring width w, is equal to the photolithographic minimum dimension of the fabrication technology. However, where an isolation ring is a border between an active area and an inactive area, there is no circuit density advantage in using a minimum dimension isolation ring. In this case, the dimension selected for the width of the isolation ring can then be a compromise between defect sensitivity and planarization efficiency. For example, for a technology having a minimum photolithographic dimension of 0.4 micrometer, the isolation ring width may therefore be selected to be less than about five times the minimum photolithographic dimension, or about 0.6 to about 0.8 micrometer.

Gate conductor 40 of N-FET 28 extends across active silicon area 20, terminating in contact region 42. Gate conductor 40 is located on a gate dielectric (not shown) within active area 20. Gate conductor 40 is located on isolation ring 24 and isolation path 50 where gate conductor 40 extends outside active silicon area 20. Similarly, gate conductor 44 is located on gate dielectric 46 (FIG. 1c) where gate conductor 44 extends across active silicon area 22 in n-well 32. Gate conductor 44 is located on isolation ring 26 and isolation path 48 where it extends outside active silicon area 22. Gate conductors 40 and 44 are preferably formed of a semiconductor material such as doped polysilicon, but they may also be formed of a metal, such as tungsten.

Local interconnect 60 electrically connects source/drain region 62 of n-channel FET 28 with gate conductor 44 of p-channel FET 30. Local interconnect 60 is located on isolation path 64 (which intersects isolation rings 22, 26, and 34 and isolation path 48 where local interconnect 60 extends outside active area 20. Where local interconnect 60 intersects and makes contact with gate conductor 44, local interconnect 60 is on top of gate conductor 44 which itself is on top of isolation path 48. Local interconnect 60 is formed of a conductive material, such as doped polysilicon, a metal, such as tungsten, or a metal silicide, such as WSi or TiSi.

The layout of isolation paths 48, 50, and 64 are derived from the layout of conductors 40, 44, and 60 where the conductors extend outside said the respective isolation rings. Thus, isolation paths 48 and 50 follow the pattern of gate conductors 40 and 44, and isolation path 64 follows the pattern of local interconnect 60. Isolation paths 48 and 50 are wider than gate conductors 40 and 44, and isolation path 64 is wider than local interconnect 60, the isolation paths nominally extending horizontally a distance d from the edges of gate conductors 40 and 44 and local interconnect 60.

Gate conductors and local interconnects are formed, however, in separate masking steps from isolation paths, so conductors and interconnects may therefore not be placed exactly centered on the isolation paths. Thus, for example, the horizontal spacing of isolation path 64 on one side of local interconnect 60 may differ frown the horizontal spacing on the other side, depending on the overlay of masks. Furthermore, distance d need not be the same for gate conductors and local interconnects.

Inactive silicon area 66 borders isolation rings 24 and 34 and isolation paths 50 and 64. Inactive silicon area 66' is within n-well 32 borders isolation rings 26 and 34 and isolation paths 48 and 64. Both active and inactive silicon areas are defined by the placement of isolation rings and isolation paths. Active semiconductor areas are distinguished by the presence of devices within their borders that are connected to provide a circuit function for the chip. Inactive silicon areas 66 and 66' do not have such connected structures within their borders.

The presence of inactive silicon areas 66 and 66' is valuable, since the inactive silicon areas limit the area of isolation on the chip to narrow rings and paths, and these narrow remaining regions of isolation are easily planarized without dishing. The invention takes advantage of the fact that active and inactive regions of the silicon surface are inherently planar. Thus, many of the process steps for fabricating shallow trench isolation otherwise needed to address dishing concerns are eliminated.

Advantageously, the present invention permits the designer to specify a maximum STI width while retaining adequate isolation between active silicon areas. Ideally, the maximum width is selected to be one capable of planarization either exclusively with an etch or exclusively with CMP.

In essence, the present invention provides for either polishing or etching immediately after oxide deposition without the cumbersome sequence of masking and photoresist deposition. Furthermore, the process window of the single planarization process step can also be vastly increased. With the isolation layout of the present invention, costs, defects, scrap, measurements, and cycle time associated with STI processing are all substantially reduced. Thus, the goal of providing improved design to greatly reduce process complexity is achieved.

The isolation layout of the present invention is derived from the layout of active silicon areas, gate conductors, and local interconnects. More specifically, the layout of inside edge 24a of isolation ring 24 is identical with the layout of outside edge 20a active silicon area 20. The layout of outside edge 24b of isolation ring 24 is obtained from the layout of active silicon area 20 by shifting edge 20a of active silicon area 20 outward at each point by a fixed dimension w, as illustrated in FIG. 1a. A similar process is used to derive the layout of isolation ring 26 from the layout of active silicon area 22. The active silicon areas are within these isolation rings.

Similarly, the layout for isolation paths 48 and 50 under gate conductors 40 and 44 or isolation path 64 under local interconnect 60 is obtained from the layout of gate conductor 40 and 44 or local interconnect 60 by shifting outward edge 40a, 44a, or 60a respectively of the gate conductor or local interconnect by fixed dimensions d. Path isolation within active silicon area 20 or 22 is then eliminated from the layout, as illustrated in FIG. 1a. Thus, gate conductors and local interconnects are designed to be located approximately in the center of isolation paths (but deviation of the conductors from the center of the isolation paths is expected because of mask overlay tolerance), and isolation paths extend only outside active silicon areas.

The magnitude of fixed dimension d used to derive path isolation dimensions is at least equal to the overlay tolerance of the lithographic system used in the fabrication technology. The overlay tolerance is usually a fraction of the minimum resolution of the photolithographic system. Thus, for photolithographic systems having a minimum dimension of about 0.4 um, the overlay tolerance is about 0.15 micrometer. Of course, this overlay tolerance will decrease as lithographic systems improve, and so the minimum expansion fixed dimension d is likely to decrease with each generation of semiconductor technology. However, significantly larger expansion of the isolation than the photolithographic minimum may be desirable to reduce gate conductor-to-semiconductor capacitance, trading density for performance.

Similarly, the layout of isolation ring 34 for n-well 32 (FIG. 1c) is obtained from the layout of n-well 32. For n-well isolation it is desirable that n-well junction edge 36' should not reach the original silicon surface; unction edge 36' should be located under isolation ring 34 (FIG. 1c). To provide this feature, both inside edge 34a and outside edge 34b of the isolation ring 34 are derived from the location of n-well junction edge 36'. The layout of inside edge 34a of isolation ring 34 is obtained from the layout of n-well junction edge 36' by shifting n-well junction edge 36' inward at each point by fixed dimension w1. The layout of outside edge 34b of isolation ring 34 is obtained from the layout of n-well junction edge 36' by shifting n-well junction edge 36' outward at each point by fixed dimension w2. Preferably, w2 is set to be greater than w1 since the junction diffuses outward. Thus, n-well junction edge 36' is located approximately beneath the center of isolation ring 34, and isolation ring 34 has a width of w1+w2. w1+w2 is at least equal to the minimum photolithographic dimension for the fabrication technology used.

The layout of the present invention also provides that active silicon areas or n-wells that are close together may have only a single ring of isolation therebetween. For example, in FIG. 1a, in the region between active silicon area 20 and n-well 32, inactive silicon area 166 and side 24a of isolation ring 24 can both be eliminated. Active silicon area 20 and n-well 32 can be moved closer together since isolation ring 34 provides sufficient isolation therebetween.

Alternatively, isolation shapes that have their outer edges closer than the photolithographic minimum dimension apart are merged to form a wider ring or path of isolation. For example, for a technology having an isolation ring dimension of 0.5 micrometer and a minimum photolithographic dimension of 0.4 micrometer, two active areas that are designed to be 1.35 micrometers or closer to each other will only have isolation therebetween; two active areas that are designed to be 1.4 micrometers apart or greater will have isolation around each and a band of inactive silicon area therebetween.

Figure 2:
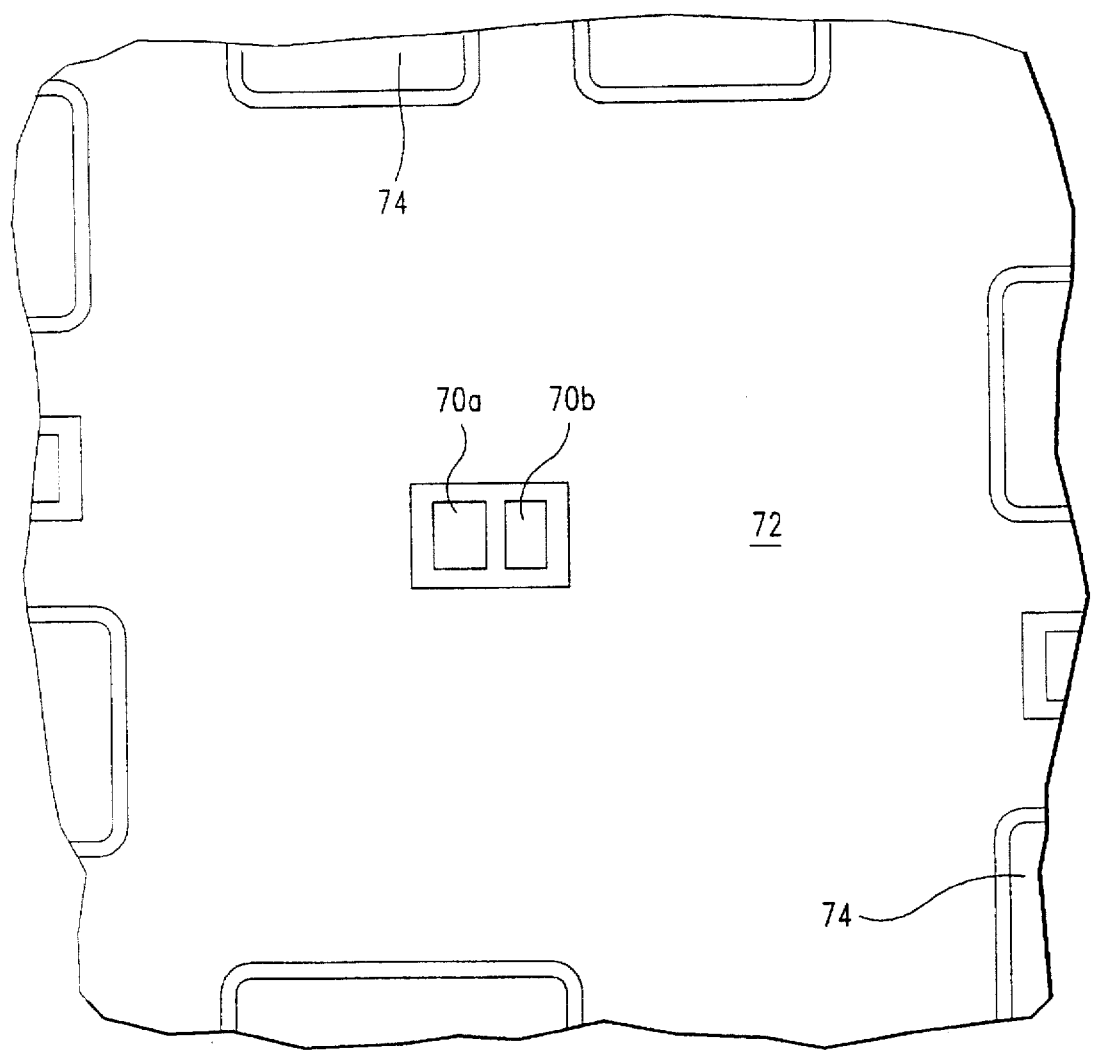
FIG. 2 is a planar diagram illustrating another embodiment of the layout of active semiconductor areas of the present invention.

Advantageously, the present invention permits small active silicon areas that are widely separated from other active silicon areas to have trench isolation while avoiding substantial dishing either of the trench insulation or of the small active silicon areas. As shown in FIG. 2, small active silicon areas 70a and 70b can be located adjacent large inactive area 72 which has an area at least 100 times greater than active semiconductor areas 70a or 70b. In addition, small active silicon areas 70a and 70b are widely separated in all directions from other active silicon areas 74, the separations being at least 5 times the dimension of active areas 70a and 70b. Of course, active silicon areas 70a or 70b can also have conductors and isolation paths as illustrated in FIG. 1a–1c.

Figure 3A:
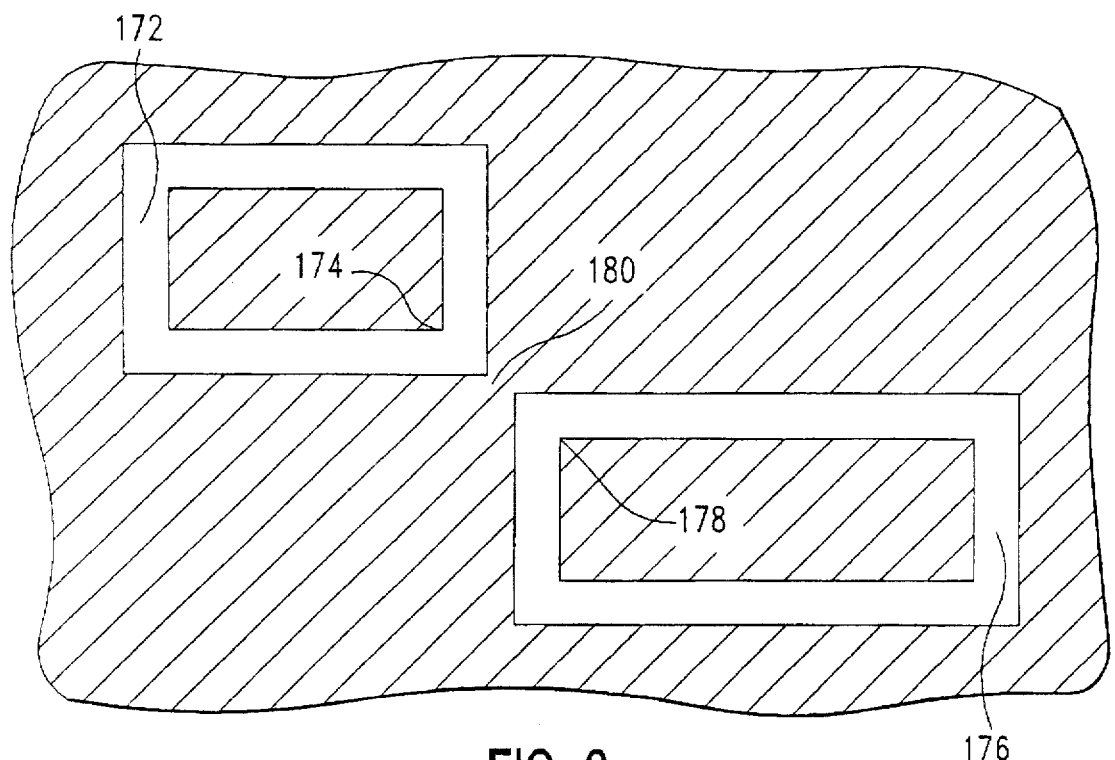
FIGS. 3a–3b are planar diagrams illustrating the layout of derived isolation structures having corners that are within a minimum photolithographic dimension of each other in violation of ground rules 3a, and a tab isolation that avoids this problem 3b.
Figure 3B:
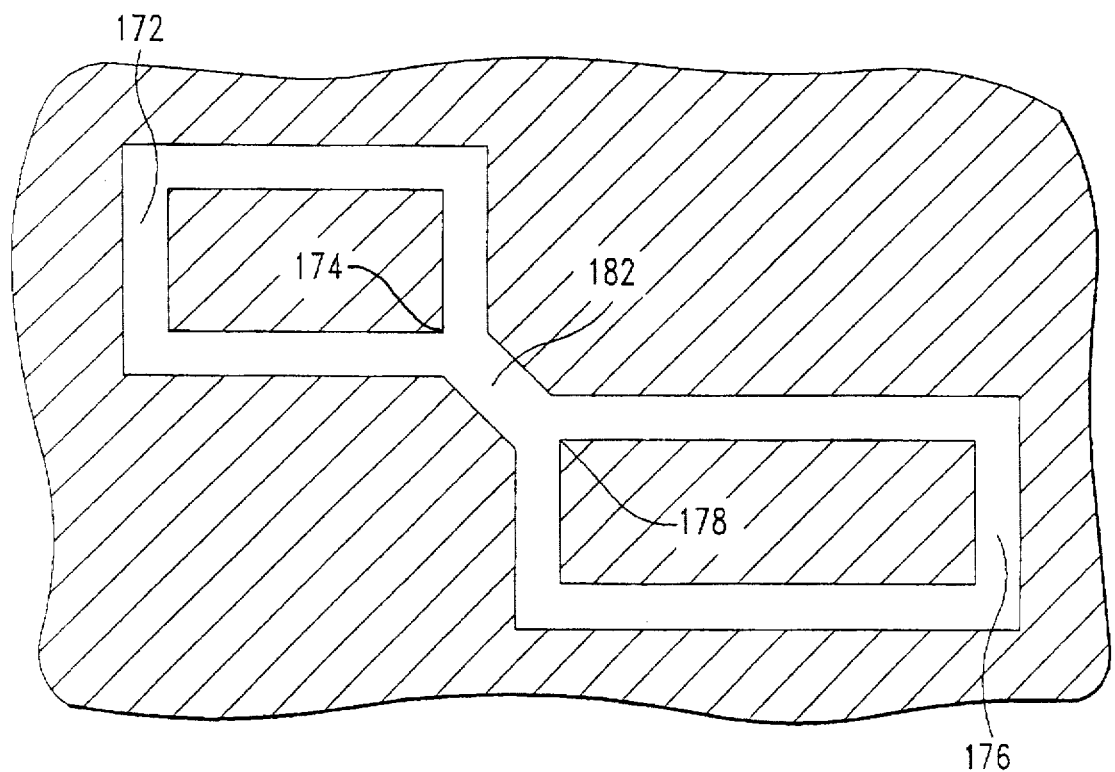

A practical problem arises either where the derived layout provides corners of two isolation structures that are closer together than a minimum dimension or where the derived layout provides corners of two isolation structures that overlap each other by less than a minimum dimension as illustrated in FIG. 3a. The isolation structures can be either isolation rings or isolation paths. The problem is that mask inspection software may categorize the resulting subminimum dimension region as a defect. In FIG. 3a isolation ring 172 which has corner 174 is within a minimum photolithographic dimension of isolation ring 176 having corner 178. Thus, inactive semiconductor area 180 therebetween has a subminimum dimension. This problem is avoided by providing isolation tab 182 in the layout between such corners, as illustrated in FIG. 3b. Isolation tab 182 links isolation ring 172 and isolation ring 176 between corner 174 and corner 178. Isolation tab 182 has a width that is at least a minimum dimension of the photolithographic technology used in the process of fabricating the isolation and less than about 2 micrometers. To save space while avoiding process difficulties, the width is selected to be less than about 2 times the minimum dimension of the photolithographic system used for defining the isolation.

Two other problems arise associated with very large inactive silicon areas. First, there may be a pair of defects shorting two separate active silicon areas to the same inactive silicon area, thereby shorting the two active silicon areas to each other. The probability of such a double shorting event can be reduced by a layout that breaks up very large inactive silicon areas into a plurality of smaller inactive silicon areas separated by narrow lines of isolation.

Second, because large expanses of unbroken inactive silicon area present a full surface of oxide to the polishing pad, as compared to the partially coated surface in other areas having a high density of active device areas, polishing uniformity will decrease in a layout having such diversity. This problem is also reduced by adjusting the layout to break up the large inactive silicon areas Into a plurality of smaller inactive silicon areas, using enough isolation stripes to provide a roughly uniform silicon-to-isolation ratio in all regions of the chip.

Preferably, inactive silicon areas are doped to provide n-doping to inactive silicon areas within an n-well and p-doping to inactive silicon areas outside an n-well. Opposite doping for the inactive silicon areas is also acceptable.

Figure 4:
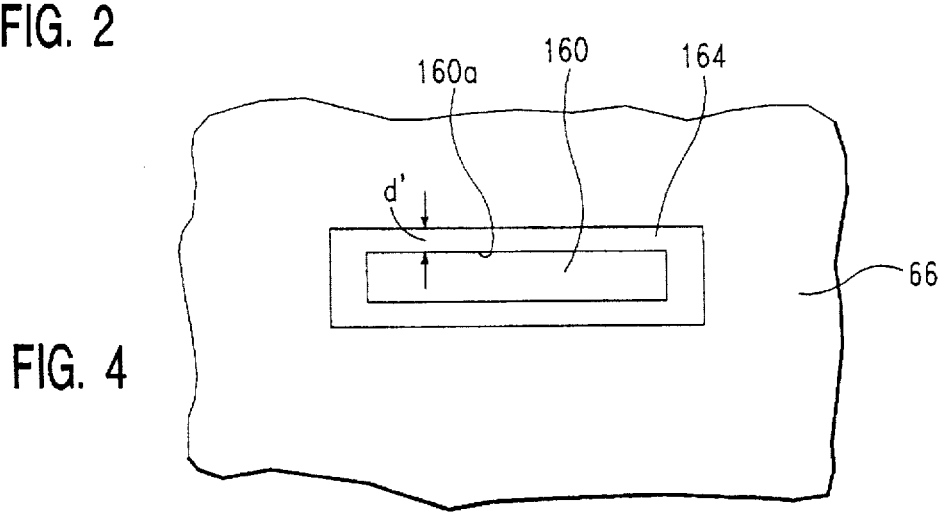
FIG. 4 is a planar diagram illustrating the layout of a resistor located on path isolation surrounded by an inactive semiconductor area according to the present invention.

Another embodiment of the present invention is shown in FIG. 4, in which elongate conductor 160 is located on elongate trench isolation path 164. Trench isolation path 164 is surrounded by inactive silicon area 66. Trench isolation path 164 extends horizontally beyond conductor 160 on all sides, preventing contact and reducing capacitive coupling between conductor 160 and inactive silicon area 66. The layout of trench isolation path 164 is obtained from the layout of conductor 160 by shifting edge 160a of conductor 160 outward at each point by a fixed dimension d'. Fixed dimension d' is at least an overlay tolerance of the photolithography system used for fabrication of the conductor. However, significantly larger expansion of the isolation than the photolithographic minimum may be desired to reduce conductor-to semiconductor capacitance or to increase process latitude. Fixed dimension d' is typically up to about 10 micrometers. Preferably, conductor 160 is centered on isolation path 164 approximately within the overlay tolerance of the photolithographic system used for its fabrication. Isolated conductor 160 is formed of a material such as polysilicon or a metal, and is used as a resistor or as an interconnect between upper level conductors.

While several embodiments of the invention, together with modifications thereof, have been described in detail herein and illustrated in the accompanying drawings, it will be evident that various further modifications are possible without departing from the scope of the invention. For example, a variable dimension rather than a fixed dimension can be used to derive isolation rings and isolation paths. The dimension may vary depending on the density of active areas, the relative isolation of a structure, or other factors. Nothing in the above specification is intended to limit the invention more narrowly than the appended claims. The examples given are intended only to be illustrative rather than exclusive.

What is claimed is:

1. A semiconductor structure, comprising:
    a semiconductor substrate comprising an isolation ring having an inside edge and an outside edge, said isolation having an isolation thickness;
    an active semiconductor area bordering said inside edge, said active semiconductor area comprising a device, inactive semiconductor bordering said outside edge;
    an isolation path extending from said outside edge to a location on said substrate outside said isolation ring, said isolation path having at least two sides, there being an inactive semiconductor area bordering each of said at least two sides; and
    a first level conductor on said isolation path electrically connecting or capacitively coupling said device to said location, said isolation thickness sufficient to substantially isolate said conductor from electrical connection or capacitive coupling with said inactive semiconductor, there being no device within said inactive semiconductor connected to provide a circuit function for semiconductor structure.

2. A semiconductor structure as recited in claim 1, said conductor having a first pattern outside said active semiconductor area, said isolation path having a second pattern, said second pattern being said first pattern shifted outward by a fixed dimension.

3. A semiconductor structure as recited in claim 2, said fixed dimension being less than or equal to about 10 micrometers.

4. A semiconductor structure as recited in claim 1, said isolation ring having a width, said width being less than or equal to about 10 micrometers.

5. A semiconductor structure as recited in claim 1, said conductor connected to a second device in a second active semiconductor area.

6. A semiconductor structure as recited in claim 1, said first isolation flag having a first corner, the semiconductor structure further comprising a second isolation ring having a second corner and an isolation tab linking said first corner and said second corner.

7. A semiconductor structure, comprising:
    a semiconductor substrate comprising a semiconductor surface, a first isolation ring and a second isolation ring, a first active semiconductor area within said first ring, a second active semiconductor area within said second ring, an inactive third semiconductor area outside of said first ring and said second ring; and
    an isolation path extending from said first ring to said second ring, said isolation path extending through said inactive third semiconductor area.

8. A semiconductor structure as recited in claim 7, wherein said isolation rings extend below said surface.

9. A semiconductor structure as recited in claim 7, wherein a first device is within said first active semiconductor area and a second device is within said second active semiconductor area.

10. A semiconductor structure as recited in claim 7, wherein there is no device within said inactive third semiconductor area that is connected to provide a circuit function for the semiconductor structure.

11. A semiconductor structure as recited in claim 7, wherein said isolation path extends below said surface.

12. A semiconductor structure as recited in claim 11, wherein said isolation path extends more than five times a gate dielectric thickness below said surface.

13. A semiconductor structure as recited in claim 7, wherein said isolation path comprises a dielectric.

14. A semiconductor structure as recited in claim 13, wherein said isolation path comprises shallow trench isolation.

15. A semiconductor structure as recited in claim 7, wherein said isolation path has a width that is less than about 2 micrometers.

16. A semiconductor structure as recited in claim 7, further comprising a first level conductor on said isolation path.

17. A semiconductor structure as recited in claim 7, wherein said isolation path has a path width, said conductor has a conductor width, said conductor width being less than said path width, said isolation path substantially isolating said conductor from electrical connection or capacitive coupling with said inactive third semiconductor area.

18. A semiconductor structure as recited in claim 7, wherein said first isolation ring has a first corner, said second isolation ring has a second corner, said isolation path being an isolation tab linking said first corner and said second corner.

19. A semiconductor structure as recited in claim 1, wherein said semiconductor further comprises a semiconductor surface, said isolation comprising dielectric extending below said surface.

20. A semiconductor structure as recited in claim 19, wherein said isolation comprises shallow trench isolation.

* * * * *